(12) United States Patent
Rodder

(10) Patent No.: US 6,461,928 B2
(45) Date of Patent: Oct. 8, 2002

(54) METHODOLOGY FOR HIGH-PERFORMANCE, HIGH RELIABILITY INPUT/OUTPUT DEVICES AND ANALOG-COMPATIBLE INPUT/OUTPUT AND CORE DEVICES USING CORE DEVICE IMPLANTS

(75) Inventor: Mark S. Rodder, University Park, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/843,559

(22) Filed: Apr. 26, 2001

(65) Prior Publication Data
US 2001/0046748 A1 Nov. 29, 2001

Related U.S. Application Data
(60) Provisional application No. 60/206,355, filed on May 23, 2000.

(51) Int. Cl.[7] .............................................. H01L 21/331
(52) U.S. Cl. ........................ 438/373; 438/305; 438/309; 438/372
(58) Field of Search ................................ 438/373, 305, 438/309, 372

(56) References Cited

U.S. PATENT DOCUMENTS

| | | | |
|---|---|---|---|
| 5,015,595 A | * | 5/1991 | Wollesen .................... 437/31 |
| 5,432,114 A | | 7/1995 | O |
| 5,580,805 A | | 12/1996 | Kuroda |
| 6,001,677 A | * | 12/1999 | Shimizu ..................... 438/231 |
| 6,037,222 A | * | 3/2000 | Huang et al. ............... 438/257 |
| 6,184,099 B1 | * | 2/2001 | Bergemont et al. ......... 438/305 |
| 6,291,327 B1 | * | 9/2001 | Li et al. ..................... 438/530 |
| 6,306,702 B1 | * | 10/2001 | Hao et al. ................... 438/231 |

OTHER PUBLICATIONS

Miyamoto et al, "Asymmetrically–Doped Buried Layer (ADB) Structure CMOS for Low–Voltage Mixed Analog–Digital Applications," 1996 Symposium on VLSI Technology. Digest of Technical Papers. Honolulu, Jun. 11–13, 1996, pp. 102–103.

* cited by examiner

Primary Examiner—Hoai Ho
Assistant Examiner—Thao P. Le
(74) Attorney, Agent, or Firm—Jacqueline J. Garner; W. James Brady, III; Frederick J. Telecky, Jr.

(57) ABSTRACT

A method for fabricating an integrated circuit having analog and digital core devices. Using a first masking layer (118), a p-type type dopant is implanted to form drain extension regions (126, 122, 124) in the pMOS digital core region (102), pMOS I/O region (104), and the pMOS analog core region (106). Using a second masking layer (132), a n-type dopant is implanted into at least a drain side of the nMOS analog core region (110) and the nMOS I/O region (108) to for drain extension regions (142, 144) and into the pMOS digital core region (102). This forms a pocket region (140) in the pMOS digital core region (102) but not the pMOS analog core region (106) or the pMOS I/O region (104).

15 Claims, 2 Drawing Sheets

METHODOLOGY FOR HIGH-PERFORMANCE, HIGH RELIABILITY INPUT/OUTPUT DEVICES AND ANALOG-COMPATIBLE INPUT/OUTPUT AND CORE DEVICES USING CORE DEVICE IMPLANTS

This application claims priority under 35 USC §119(e)(1) of provisional application No. 60/206,355 filed May 23, 2000.

FIELD OF THE INVENTION

The instant invention pertains to semiconductor device fabrication and processing and more specifically to a method of integrating implantation steps so as to form high-performance, high-reliability devices.

BACKGROUND OF THE INVENTION

Implantation of dopants into the semiconductor substrate (or epitaxial silicon layer which overlies the semiconductor substrate) is important in semiconductor device fabrication. Many different implantation steps need to be performed so as to: dope the polycrystalline silicon ("poly" or "polysilicon") gate structure, form drain extensions, form pockets, form source and drain regions, form isolation structures, and to increase or decrease the conductivity of semiconductor structures. A problem with all of these implantation steps is that they may require separate masks so as to block the implantation of dopants from one region while exposing other regions to the implantation of dopants. Formation of these masks is very expensive and can be quite difficult to implement due to the ever-shrinking feature sizes and the difficulties associated with present limitations on photolithography. Some relief from these problems can be achieved by using existing structures to act as masks for the implantation of dopants. For example, the gate structure (not including a sidewall spacer) and the isolation structures can be used to define the region where the drain extensions are formed. In addition, the isolation structures and the gate structure, which includes a sidewall spacer, can be used to define the region in which dopants are implanted to form the source and drain regions. However, this self-alignment methodology can not solve all of the problems related to precisely implanting dopants into these semiconductor structures.

In semiconductor chips which utilizes many different types of devices, such as nMOS and pMOS logic transistors, higher bias voltage transistors, analog transistors, and others, many different masks are used to form the various doped regions. For example, the drain extensions (also referred to as "lightly doped drain extensions" or "LDD's") are typically formed separately for each device type. In additions, the pocket implants are formed separately, as are the source/drain implants. With all of these different masks, the process becomes quite complex (especially since all of these mask are critical masks) and quite expensive.

Hence, there is a need for a methodology which will result in the implantation to form a structure in one device without damaging other exposed structures (which would not have typically been doped with this dopant) while reducing the number of masking steps required to make a plurality of different device types.

SUMMARY OF THE INVENTION

The invention is a method for fabricating an integrated circuit having analog and digital core devices. Using a first masking layer, a first conductivity type dopant is implanted into the first (e.g., pMOS) digital core transistor region and the first (e.g., pMOS) analog core region. I/O transistors may also be implanted. Using a second masking layer, a second conductivity type dopant is implanted into at least a drain side of a second (e.g., nMOS) analog core region and the first (e.g., pMOS) digital core region. This forms a pocket region in the digital core region but not the analog core region or the I/O region.

An advantage of the invention is providing a method for fabricating an integrated circuit having pMOS and nMOS core digital devices, nMOS and pMOS core analog devices and, if desired, nMOS and pMOS I/O devices using only one additional mask from that required to for the pMOS and nMOS core digital devices.

BRIEF DESCRIPTION OF THE DRAWINGS

Similar reference numerals are used throughout the figures to designate like or equivalent features. The figures are not drawn to scale. They are merely provided to illustrate the affect of the method of the instant invention.

DETAILED DESCRIPTION OF THE DRAWINGS

One concern in mixed voltage CMOS device fabrication relates to the cost and complexity associated with adding separate LDD masks for the input/output devices ("I/O devices") so as to achieve robust channel hot carrier reliability without appreciably degrading the performance of other devices. The instant invention utilizes a minimal amount of masks to form the I/O device drain extensions for both pMOS and nMOS devices while not appreciably degrading the performance or the reliability of the core devices. In one embodiment of the instant invention the following process use utilized: use $BF_2$ HDD implant to form the pMOS core drain extensions, the drain extensions for the pMOS I/O devices (while avoiding the formation of pockets for the pMOS I/O devices), and the drain extensions for the pMOS analog core devices (while avoiding the formation of pockets for the pMOS analog core devices); and use phosphorous pocket implant to form pMOS core device pockets, nMOS I/O device drain extensions (while avoiding the formation of nMOS I/O device pockets), and the drain extensions for the nMOS analog core devices.

While the following description of the instant invention involves the formation of specific devices, it is possible to use the methodology of the instant invention to simultaneously form devices of the opposite conductivity type by using dopants of the opposite conductivity type. Furthermore, similar devices of as those described below may be formed simultaneously with these devices using the methodology of the instant invention. The anneal steps which follows the implantation steps of the instant invention can be performed using conventional rapid thermal annealing, furnace annealing, laser anneal, or any other conventional thermal processing.

Figure 1:
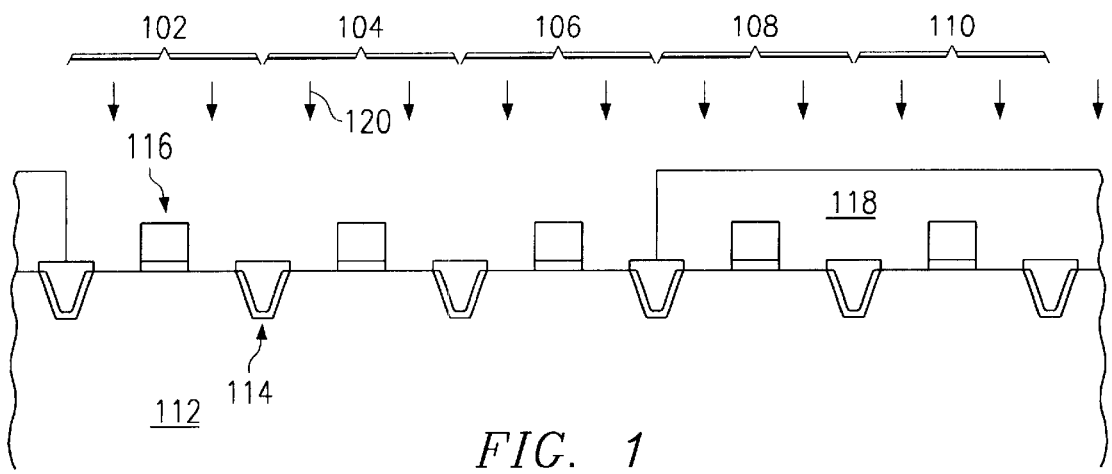
FIGS. 1–3 are cross-sectional views of a partially fabricated device that is fabricated using the method of one embodiment of the instant invention.

Referring to FIG. 1, isolation structures 114 are formed in semiconductor structure 112 (preferably comprised of either single-crystal silicon or an epitaxial silicon layer formed on a single-crystal silicon substrate). Isolation structures 114 may be comprised of shallow trench isolation structures ("STI"), field oxide regions, doped isolation regions, a combination of the above, or any other conventional isolation structure. Gate structures 116 are formed in pMOS digital core region 102, pMOS I/O region 104, pMOS analog core region 106, nMOS I/O region 108, and nMOS analog core region 110. Preferably, gate structure 116 is comprised of a gate conductor (preferably comprised of doped polycrystalline silicon, a silicide, a metal, or a combination thereof) situated on a gate dielectric layer (preferably silicon dioxide, silicon nitride, an oxynitride, a high dielectric constant material, a stack thereof, or any combination thereof). Masking layer 118 (which may be comprised of photoresist or a hardmask, such as an oxide, a nitride, or any other masking material) is formed a patterned so as to expose pMOS digital core region 102, pMOS I/O region 104, and pMOS analog core region 106, while blocking nMOS I/O region 108, and nMOS analog core region 110.

Next, a blanket implantation step is performed in which a p-type dopant is preferably implanted into the exposed p-type regions. Preferably, the p-type dopant includes boron (more preferably $BF_2$), but could include any type of p-type dopants and/or any inert species. The implant conditions are preferably $BF_2$, 5–15 keV, 1–10E14 $cm^{-2}$. An anneal step, whether a rapid thermal anneal or a furnace anneal, may be performed after this implantation step if desired. An advantage of this implantation step of the instant invention is that the drain extensions are formed for this reliable pMOS I/O device 104 simultaneously with the drain extension for the analog-friendly pMOS core device 106 while not degrading the performance or reliability of pMOS digital core device 102 or the nMOS devices.

Figure 2:
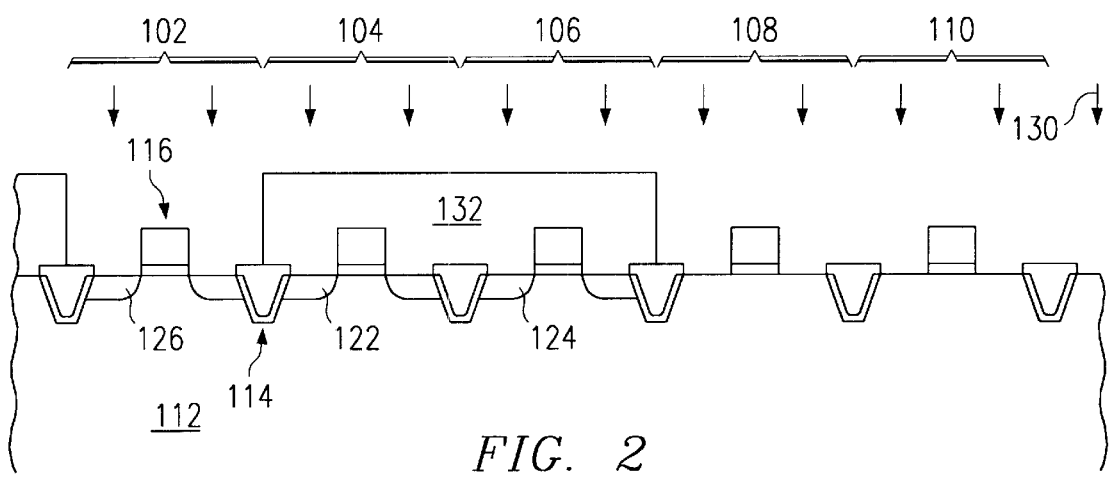

Referring to FIG. 2, the result of the above implantation steps are drain extension regions 122, 124, and 126. Next, masking layer 118 is removed using conventional processing techniques and mask layer 132 is formed. Mask layer 132 is preferably comprised of photoresist or any type of hardmask material, and it, preferably, exposes pMOS digital core region 102, nMOS I/O region 108, and nMOS analog core region 110 while covering pMOS I/O region 104, and pMOS analog core region 106.

A blanket implant of an n-type dopant is performed, next. Preferably, the n-type is comprised of phosphorus, arsenic, and/or any other conventional n-type dopant (and an inert species may or may not be included with this implantation step). The implant conditions are preferably P, 40–70 keV, 1–10E13 $cm^{-2}$. An anneal step, whether a rapid thermal anneal or a furnace anneal, may be performed after this implantation step. An advantage of this implantation step of the instant invention is that drain extensions are formed for reliable nMOS I/O device 108 and analog-friendly nMOS core 110 while not degrading the performance or reliability of pMOS devices 102, 104, or 106.

Figure 3:
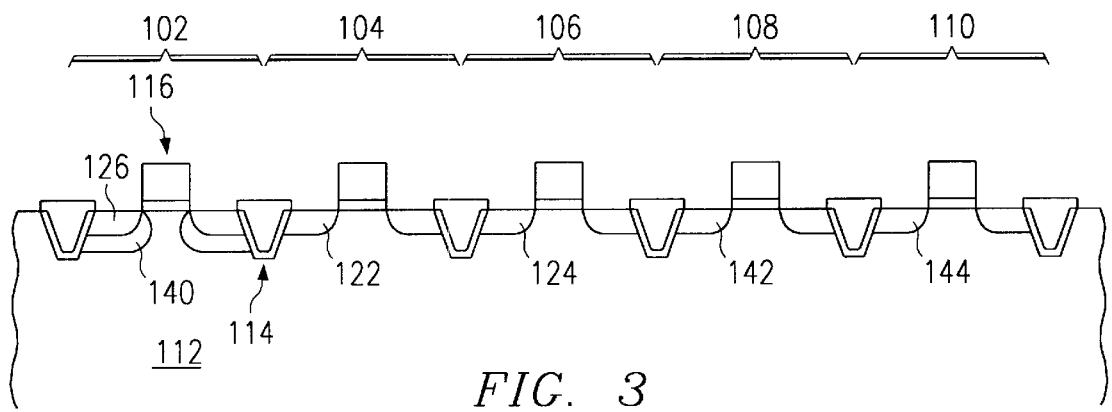

The result of implant 130 can be seen in FIG. 3. Pocket 140 in pMOS digital core device 102 and drain extensions 142 and 144 in nMOS I/O device 108 and nMOS analog core device 110, respectively. Masking layer 132 is removed and standard processing is performed so as to compete fabrication of these devices and other semiconductor devices.

Figure 4A:
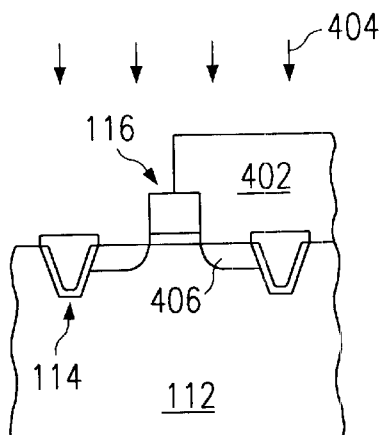
FIGS. 4a–4b are cross-sectional views of a partially fabricated device that is fabricated using the method of another embodiment of the instant invention.
Figure 4B:
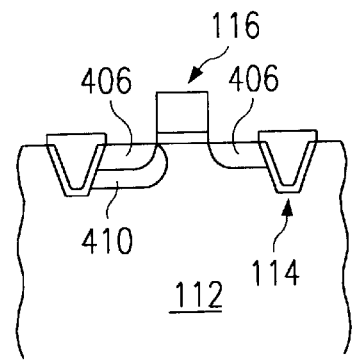
Figure 5A:
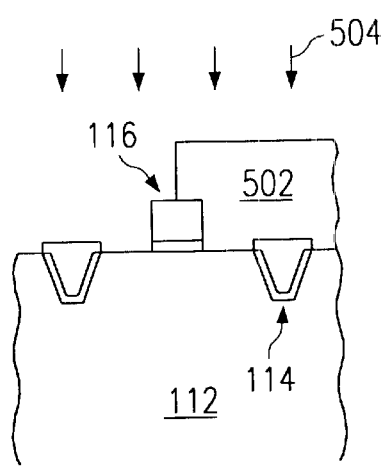
FIGS. 5a–5c are cross-sectional views of a partially fabricated device that is fabricated using the method of yet another embodiment of the instant invention.
Figure 5B:
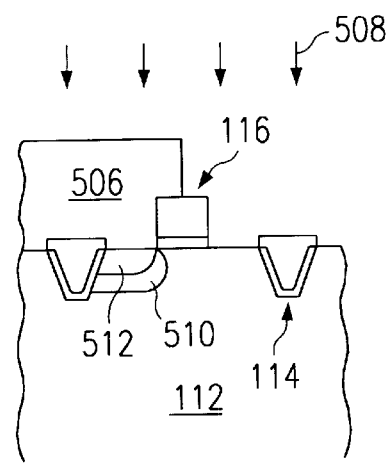
Figure 5C:
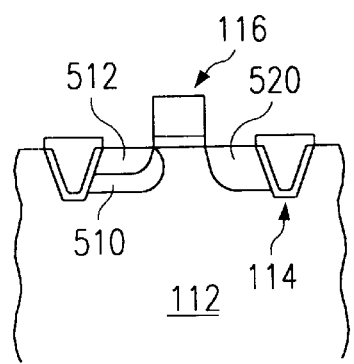

FIGS. 4a–4b and 5a–5c illustrate how the methodology of the instant invention can be utilized to fabricate asymmetrical devices. FIGS. 4a–4b illustrate the fabrication of an asymmetrical pMOS analog core device. FIGS. 5a–5c illustrate the fabrication of an asymmetrical nMOS analog core device. Drain extension regions 406 are formed using a p-type implant (preferably a boron-containing implant, such as $BF_2$) and a symmetrical mask which allows the implant into both the source and drain regions. This may be performed simultaneously with implant 120 in FIG. 1. An anneal step (preferably either a rapid thermal anneal step, a furnace anneal, a laser anneal, or any other conventional anneal) may be performed directly after this implantation step or later in the process.

Next, mask 402 is formed (which may be the same as mask 132) so as to block the either the source or drain side, but preferable the drain side of the pMOS device. An n-type implant is performed, next. Preferably, the process conditions for this implant step are P, 40–70 keV, 1–10E13 $cm^{-2}$. The dopant species is comprised of phosphorous, arsenic, an inert species, a combination of the above, or any other n-type dopant. Pocket 410 results from this implantation step and may be followed by a subsequent anneal, which may be performed by rapid thermal annealing, furnace annealing, or any other conventional annealing step.

Referring to FIGS. 5a–5c, masking layer 502 is formed (preferably of photoresist or any conventional hardmask material) so as to block either the source region or drain regions, but preferably the drain region of this nMOS device while exposing the source region. Implant 504 is performed, next, so as to form drain extension region 512 and pocket 510. Preferably, implant 504 is comprised of both n-type dopants (to form drain extension region 512) and p-type dopants (to form pocket 510). The n-type dopant is preferably comprised of arsenic, phosphorous, an inert species, a combination of the above, or any other n-type species, and the p-type dopant is preferably comprised of boron. The implant conditions are preferably As 5–15 keV, 1–10E14 $cm^{-2}$ and B, 5–20 keV, 0.5–5E13 $cm^{-2}$.

Masking layer 502 is removed. Masking layer 508 is formed and may be the same as masking layer 132 (preferably of photoresist and/or a hardmask material) so as to cover the source region while leaving the drain region exposed. Implant 508 is performed, next, so as to form drain extension region 520. Preferably, implant 508 is comprised of an n-type dopant (preferably phosphorous, arsenic, an inert species, a combination of the above, or any other n-type species), and the preferable implant conditions for this step are P, 40–70 keV, 1–10E13 $cm^{-2}$.

By using the instant invention for the formation of I/O devices and core devices, only one additional mask, from that required to form the pMOS and nMOS core digital devices, is required to additionally form the nMOS I/O, and pMOS I/O, nMOS analog core, and pMOS analog core devices. It is noted that the core pMOS device is unchanged since the implants for the core pMOS device are unchanged from the desired implant; rather, the core implants have been used to form devices other than the pMOS core digital device.

For digital core pMOS devices with analog-friendly nMOS and pMOS cores, the methodology of the instant invention is preferably utilized even if the I/O devices are not formed. In other words, the presence of I/O devices is not required to achieve all the benefits of the methodology of the instant invention.

Although specific embodiments of the present invention are herein described, they are not to be construed as limiting the scope of the invention. Many embodiments of the present invention will become apparent to those skilled in the art in light of methodology of the specification. The scope of the invention is limited only by the claims appended.

I claim:

1. A method for fabricating an integrated circuit, comprising the steps of:

forming a plurality of gate electrodes over a semiconductor body;

implanting a first conductivity type dopant into a first digital core and a first analog core region using a first masking layer; and implanting a second conductivity type dopant into at least a drain side of a second analog core region and the first digital core region using a second masking layer.

2. The method of claim 1, wherein said step of implanting a first conductivity type dopant also implants into a first I/O region and said step of implanting a second conductivity type dopant also implants into a second I/O region.

3. The method of claim 1, wherein said first conductivity type dopant is a p-type dopant, the second conductivity type dopant is an n-type dopant, the first digital core region is a pMOS digital core region; the first analog core region is a pMOS analog core region, and the second analog core region is an nMOS analog core region.

4. The method of claim 1 wherein said first conductivity type dopant comprises boron.

5. The method of claim 1, wherein said second conductivity type dopant comprises phosphorous.

6. The method of claim 1, wherein said step of implanting the second conductivity type dopant also implants into a source side of the first analog region.

7. The method of claim 1, wherein said at least a drain side comprises both the drain side and a source side of the second analog core region.

8. The method of claim 1, wherein said at least a drain side comprises only the drain side the second analog core region and further comprising the step of forming a drain extension region and a pocket region on a source side of the second analog core region using a third masking layer.

9. A method for fabricating an integrated circuit, comprising the steps of:

forming a plurality of gate electrodes over a semiconductor body;

forming a first masking layer of the semiconductor body, wherein said first masking layer exposes a pMOS digital core region and a pMOS analog core region and covers an nMOS analog core region;

implanting a p-type dopant into the pMOS digital core and the pMOS core analog region using a first masking layer;

removing said first masking layer;

forming a second masking layer over the semiconductor body, wherein the second masking layer exposes at least a drain side of the nMOS analog core region and the pMOS digital core region and covers the pMOS analog core region; and implanting an n-type dopant into at least the drain side of the nMOS analog core region and the pMOS digital core region using a second masking layer.

10. The method of claim 9, wherein said step of implanting the p-type dopant also implants into a pMOS I/O region and said step of implanting the n-type dopant also implants into a nMOS I/O region.

11. The method of claim 9 wherein said p-type dopant comprises boron.

12. The method of claim 9, wherein said n-type dopant comprises phosphorous.

13. The method of claim 9, wherein said step of implanting the n-type dopant also implants into a source side of the pMOS analog region.

14. The method of claim 9, wherein said at least a drain side comprises both the drain side and a source side of the nMOS analog core region.

15. The method of claim 9, wherein said at least a drain side comprises only the drain side of the nMOS analog core region and further comprising the step of forming a drain extension region and a pocket region on a source side of the nMOS analog core region using a third masking layer.

* * * * *